United States Patent [19]

Beling

[11] Patent Number: 4,683,472

[45] Date of Patent: Jul. 28, 1987

[54] SIGNAL READING SYSTEM SUCH AS FOR REMOTE READING OF METERS

[75] Inventor: Thomas E. Beling, Saxonville, Mass.

[73] Assignee: Sigma Instruments, Inc., Braintree, Mass.

[21] Appl. No.: 405,689

[22] Filed: Aug. 5, 1982

[51] Int. Cl.⁴ ............................................. G08C 13/00
[52] U.S. Cl. ........................... 340/870.02; 340/870.29; 73/488
[58] Field of Search ....................... 340/870.02, 870.03, 340/870.29, 870.37, 870.31, 310 A; 179/2 AM; 250/231 SE; 324/104, 160, 166, 175; 73/488, 491, 506, 518

[56] References Cited

U.S. PATENT DOCUMENTS

| | | | |
|---|---|---|---|
| 1,721,375 | 7/1929 | De Koning | 340/870.03 |
| 2,566,868 | 9/1951 | Allia | 324/175 X |
| 2,940,312 | 6/1960 | Smith et al. | 324/175 X |
| 3,012,144 | 12/1961 | Martin | 324/175 |
| 3,599,194 | 8/1971 | Lipscomb | 340/870.02 |
| 3,786,423 | 1/1974 | Martell | 340/870.02 |
| 4,254,403 | 3/1981 | Perez-Cavero | 340/310 R |
| 4,415,853 | 11/1983 | Fisher | 340/870.02 |

Primary Examiner—Ulysses Weldon

[57] ABSTRACT

In the disclosed system, recurring signals, such as from a watt-hour meter or other type of meter, are registered, by sensing the signals, converting the signals to mechanical motions, and applying them to a mechanical register so that the register accumulates the motions sensed by the amplifier and indicates a value representative of the accumulated total of the signals. According to one embodiment of the invention, a sensor senses the signals formed by gaps in the rotating disc of a watt-hour meter and an amplifier drives a stepping motor on the basis of the signals. The stepping motor advances an odometer whose non-volatile output can be read visually or scanned electronically over a telephone line.

19 Claims, 25 Drawing Figures

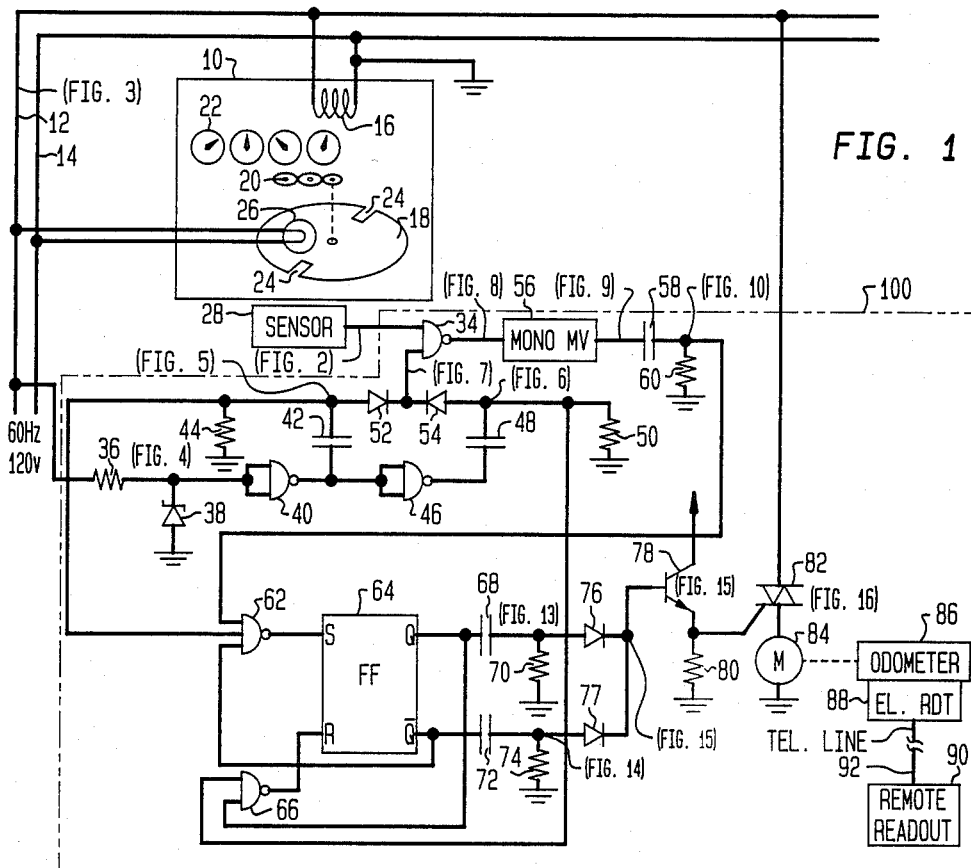
FIG. 1
FIG. 2 AT 28
FIG. 9 AT 56
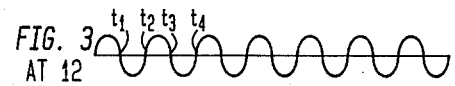
FIG. 3 AT 12
FIG. 10 AT 58
FIG. 4 AT 38
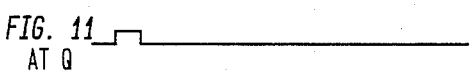
FIG. 11 AT Q
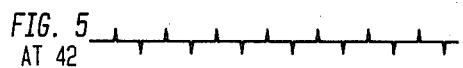
FIG. 5 AT 42
FIG. 12 AT $\bar{Q}$
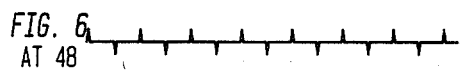
FIG. 6 AT 48
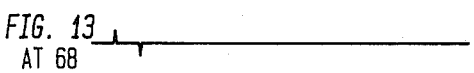
FIG. 13 AT 68
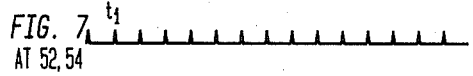
FIG. 7 AT 52,54
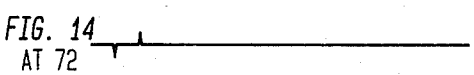
FIG. 14 AT 72
FIG. 8 AT 34
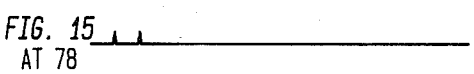
FIG. 15 AT 78
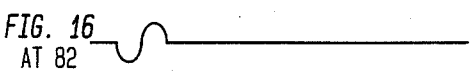
FIG. 16 AT 82

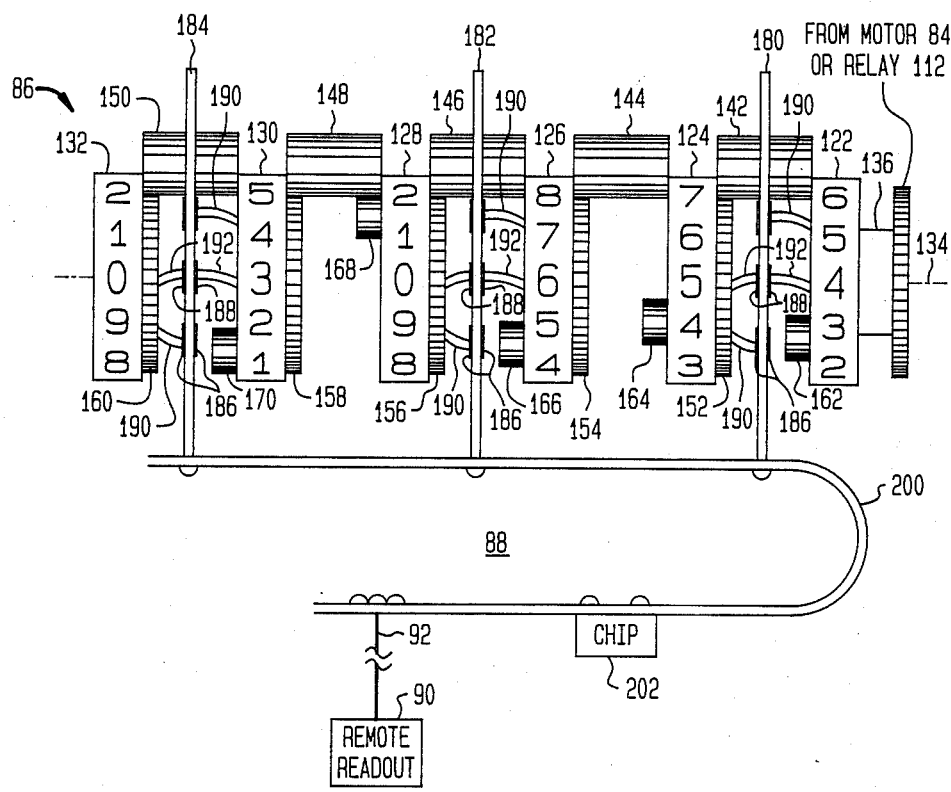
FIG. 23
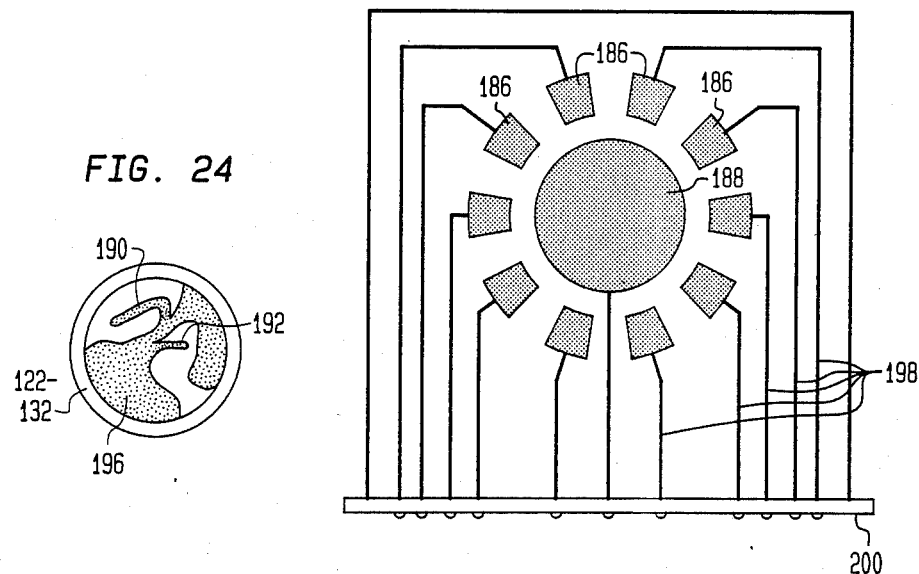
FIG. 24
FIG. 25

SIGNAL READING SYSTEM SUCH AS FOR REMOTE READING OF METERS

BACKGROUND OF THE INVENTION

This invention relates to signal registration devices and particularly to devices for remote reading of meters, especially watt-hour meters, gas meters, water meters, etc. which accumulate values over periods of time.

In meters such as watt-hour meters, gas meters, and water meters, a rotating member usually drives an internal gearing mechanism which shifts a numerical display that exhibits the accumulated total of energy, gas, or water used over a period of time. Effectively, the gearing mechanism accumulates the instantaneous quantities continuously being measured. The accumulated total displayed is non-volatile and may be examined by a meter reader at any time. However, the disc supplies very little torque to the display. Hence, the data cannot easily be transmitted to remote locations. Therefore, such meters are difficult and expensive to read from remote locations, such as public utility offices, where the information thereon is required. Even when the information in such meters can be remotely sensed with electronic devices, the information is often rapidly lost because of the volatile nature of such devices.

An object of the invention is to overcome the aforementioned difficulties.

Another object of the invention is to measure and accumulate weak recurring signals so that they can be read and stored at remote locations.

Still another object of the present invention is to provide a mechanical register for meters such as watt-hour meters, gas meters, and water meters, and to permit such mechanical registers to be read easily, either electronically or visually.

SUMMARY OF THE INVENTION

According to a feature of the present invention, these objects are attained, in whole or in part, by sensing the values to be obtained electrically with a sensor, coupling a transducing amplifier, that converts electrical signals to mechanical motions, to the sensor and to a mechanical register, so as to convert electrical signals formed by the sensor to mechanical motions and so as to apply the mechanical motions to the register and thereby cause the register to accumulate the motions and indicate a value representative of the accumulated signals. Preferably, the amplifier amplifies the signals mechanically.

According to another feature of the invention, the mechanical register is in the form of an odometer.

According to another feature of the invention, the amplifier is in the form of an electronic amplifier that applies the signals to a mechanical converter.

According to another feature of the invention, the mechanical converter is a stepping motor that drives the odometer.

According to another feature of the invention, the mechanical converter is a relay that steps the odometer.

According to another feature of the invention, the odometer includes finger switches that can be scanned by a telephone line for a remote readout.

According to another feature of the invention, the sensor senses discontinuities in a disc whose rotations correspond to a value being measured, such as a disc in a watt-hour meter.

These and other features of the invention are pointed out in the claims. Other objects and advantages will become evident from the following detailed description when read in light of the accompanying drawings.

BRIEF DESCRIPTION OF THE DRAWINGS

In the drawings:

FIG. 1 is a schematic diagram of a system embodying features of the invention.

FIGS. 2 to 16 are curves illustrating the voltages at various portions of the embodiment shown in FIG. 1.

FIGS. 23, 24, and 25 illustrate details of the odometer shown in FIGS. 1 and 22.

DETAILED DESCRIPTION OF PREFERRED EMBODIMENTS

Figure 17:
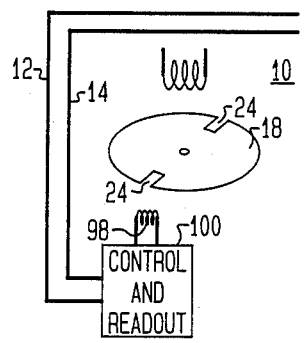
FIG. 17 is a partially schematic, partially block diagram of another system embodying features of the invention and incorporating portions of the system of FIG. 1.

In FIG. 1, a watt-hour meter 10 records the energy drawn from the lines 12 and 14 of a 60 Hz, 120 volt, service. In accordance with the usual practice, within the meter 10, a coil system 16 rotates a disc 18 at a speed determined by the power being instantaneously being drawn from the service of which the lines 12 and 14 are a part. The disc 18 drives gears 20 which accumulate the power measured over a period of time and turn a display 22 which hence indicates the energy drawn over a period of time. The watt-hour meter is designed to draw as little energy as possible. The disc 18 receives and applies minimal torque to the gears 20 and display 22.

According to an embodiment of the invention, and in order to permit remote readout of the meter, the disc 18 is provided with two breaks 24, and a light source 26, which is energized from the lines 12, 14, is positioned in the circular path of the breaks in the rotating disc 18. As each break 24 passes the source 26 during rotation of the disc 18, a photosensitive sensor 28 senses the light passing therethrough and produces a signal such as that shown in FIG. 2. The portion of the signal shown at 30 represents the voltage occurring when the light from the source 26 passes through a break 24. The variations shown at 32 represent noise resulting from extraneous signals and ragged edges on the disc 18.

The signal from the sensor 28 appears at one input of a NAND gate 34. The other input to the latter gate is developed at the lines 12 and 14 whose voltage variations are shown in FIG. 3. A resistor 36 and a Zener diode 38 reduce the amplitude of the voltage and clip the voltage shown in FIG. 3 so as to produce a square wave as shown in FIG. 4. A NAND gate 40 acting as an inverter inverts the signal appearing across the Zener diode 38, and a differentiator composed of a capacitor 42 and a resistor 44 differentiates the resulting signal to produce the pulses shown in FIG. 5. A second NAND gate 46 again inverts the signal at the NAND gate 40 and a second differentiator composed of a capacitor 48 and a resistor 44 differentiates the resulting signal so as to produce the pulses shown in FIG. 6. A pair of diodes 52 and 54 select the positive pulses of the signals appearing at the capacitors 42 and 48 and combine them into the clock signal shown in FIG. 7. It is this combined signal, which is composed of a pulse at each zero-crossover point of the 60 Hz curve in FIG. 3, that appears at the second input of the NAND gate 34. Upon simultaneous occurrence of positive voltages, such as at the times $t_1$, $t_2$, $t_3$, and $t_4$, the NAND gate 34 produces a negative output pulse as shown in FIG. 8. If the noise of the signal in FIG. 2 at 32, time $t_5$, is sufficiently high, a negative pulse may also appear at the time $t_5$.

A monostable multivibrator 56 responds to the negative signal by switching over to a positive state for a period of 100 milliseconds. This time span is one-tenth of a second and represents ten full cycles of the signals in FIGS. 3 and 4. The output of the monostable device 56 is shown in FIG. 9. A capacitor 58 and a resistor 60 form yet another differentiator which differentiates the output of the monostable multivibrator 56 as shown in FIG. 10. As can be seen at this point, only the first pulse synchronous with the zero-crossover points of the 60 Hz signal and appearing at the diodes 52 and 54 simultaneously with the signal at sensor 28 is effective at the output of capacitor 58. The remaining signals for the first six cycles, the delay span of the monostable multivator 56, have been blanked.

The output at the differentiator 58, 60 appears at one input of a NAND gate 62 together with the pulse signals occurring at the differentiator 42, 44, and the voltage at the output $\overline{Q}$ of an RS flip-flop 64. Assuming that the flip-flop 64 is reset, so that a positive voltage appears at the output $\overline{Q}$, concurrence of the sync signal at capacitor 42 shown at time $t_1$ in FIG. 5 with the pulse at capacitor 58, representing the start of the output signal of monostable multivibrator 56, produces a negative going pulse at the output of NAND gate 62 to set the flip-flop 64. Setting of the flip-flop 64 enables a NAND gate 66 whose output is connected to the reset terminal of the flip-flop. The succeeding positive pulse at the capacitor 48 of the differentiator 48, 50 occurring in FIG. 6 at the time $t_2$ is then passed by the NAND gate 66 to reset the flip-flop 64. Therefore, the flip-flop 64 is set and reset at the beginning and end of a single half cycle starting with the input to the monostable multivibrator 56. The outputs at Q and $\overline{Q}$ are shown in FIGS. 11 and 12. It will be seen that pulses only occur in the drawings during the first six cycles between the times $t_1$ and $t_2$ because of the blanking effect of the monostable multivibrator 56. A differentiator composed of capacitor 68 and resistor 70 and a second differentiator composed of the capacitor 72 and resistor 74 respectively differentiate the signals at the outputs Q and $\overline{Q}$. The resulting signals appear in FIGS. 13 and 14. Two diodes 76 and 77 combine the positive pulses as shown in FIG. 15 so as to drive an emitter-follower transistor 78 with an emitter resistor 80. The transistor produces two pulses at times $t_1$ and $t_2$ as shown in FIG. 15.

A thyristor 82 connected to the 60 Hz, 120 volt line 12 receives the pulses at the emitter of transistor 78 and turns on at the beginning of each half cycle in which a pulse occurs. This is shown in FIG. 16. At the end of the second half cycle occurring at time $t_3$, the current reversal turns the thyristor off. Current running through the thyristor steps a stepping motor 84 through an angle determined by the characteristics of the stepping motor. An example of such an angle is $7\frac{1}{2}°$. It can be seen that, within one rotation, the stepping motor is accumulating the signals produced by the sensor 28.

The motor 84 mechanically advances a mechanical odometer 86 which, by internal gearing and numbers appearing in windows, displays the total number of times a break 24 has passed between the source 26 and the sensor 28. As such, it represents a value corresponding to the energy measured by the watt-hour meter 10.

An electronic readout 88, in response to a signal from a remote readout 90 through a telephone line 92, scans the positions of the gears in the odometer 86 and transmits them through the telephone line 92 to the remote readout 90. The latter may be located in the headquarters of the public utility supplying the power along the lines 12 and 14.

The stepper motor 84 is particularly useful for advancing the odometer 86 because, in common with most stepping motors, it advances over a particular angle in response to each pulse applied thereto. According to an embodiment of the present invention, the stepping motor used is the series 9 Cyclonome manufactured by Sigma Instruments Inc. of Braintree, Massachusetts. This motor exhibits a high detent torque. That is, it has a high resistance to movement from a particular position unless a pulse is applied thereto. Then, it moves to a next position where it tends to remain. This characteristic, of course, is common to all stepping motors. However, for this purpose, high detent motors tend to avoid errors that sliding past a position might cause.

In operation, the coil system 16 responds to the instantaneous power being drawn from the lines 12 and 14 and turns the disc 18 at a rate corresponding to this withdrawal of power. As the breaks 24 pass the light source 26, they produce pulses of the type shown by 30 in FIG. 2 in the sensor 28. A signal such as 30 enables a NAND gate 34. The clipping circuit composed of resistor 36 and Zener diode 38 produces a square wave in synchronism with the 60 cycle voltage at the lines 12 and 14. A first inverter and differentiator arrangement 40 to 44 produces positive pulses at the trailing edge of each square wave and negative pulses at the leading edge of each square wave while a second inverter-differentiator arrangement 46 to 50 produces pulses of the opposite phase; both phases being shown in FIGS. 5 and 6. The positive pulses of both phases are combined by the diodes 52 and 54 and, during the signal 30, pass to a monostable multivibrator 56. The latter uses only the first of these pulses shown at FIG. 8 and turns on to blank out the effects of any remaining signal noise during six cycles of the 60 Hz signal. The output of the monostable multivibrator is differentiated so as to reproduce only the first pulse appearing at the time $t_1$. The output at the differentiators 42, 44 and 48, 50 are in synchronism with the zero-crossover points of the signals at the lines 12 and 14. They constitute clocking signals. When the clock signal at the output of the differentiator 42, 44 synchronizes the first pulse at the time $t_1$ at the output of the differentiator 58, 60, the NAND gate 62 which is normally enabled by the resetting of flip-flop 64 then sets the flip-flop 64. However, the flip-flop 64 remains in the set position for only one half cycle. Its output Q enables a NAND gate 66 which passes the very next pulse at the output of the differentiator 48, 50. This resets the flip-flop as shown in FIG. 11. The respective edges of the pulses at the outputs Q and $\overline{Q}$ are differentiated by differentiators 68 to 74 and clipped by diodes 76 and 78 so as to produce only two pulses as shown in FIG. 15. These turn on the thyristor 82 for one full cycle and step the motor 84. The latter steps the odometer whose position can be electronically read at a remote readout 90 through a telephone line at any time.

According to another embodiment of the invention, the sensor 28 is not photoelectric but rather magnetic. Such a sensor is shown in FIG. 17, wherein the circuit of FIG. 1 is otherwise the same. Here, the disc 18 also is provided with breaks 24. The sensor is shown as 98. The remainder of the entire circuit shown in FIG. 1 is here designated as control and readout 100. Thus, FIG. 17 constitutes another embodiment of the entire system of FIG. 1.

Figure 18:
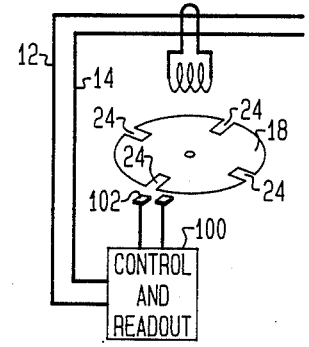
FIG. 18 is a partially schematic, partially block diagram of another system embodying features of the invention and incorporating portions of the system of FIG. 1.

Yet another embodiment of the invention is shown in FIG. 18. Here, the sensor is capacitive. Here, a capacitive sensor 102 senses the breaks 24. Four breaks 24 are shown. The number of breaks varies in dependence upon the rate at which the odometer is to be advanced.

Figure 19:
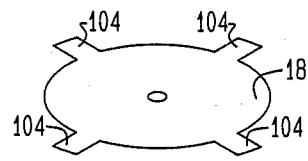
FIG. 19 is a perspective view of a disc with discontinuities for use in the meters of the systems in FIGS. 1, 17, 18, 20, and 21.

FIG. 19 illustrates another type of disc usable in the embodiments shown in FIGS. 1, 17, and 18. Here, in place of the breaks 24, fins 104 extend beyond the periphery of the disc. The sensors are located outside of the periphery to capture movement of the extensions 104 past the sensor during rotation of the disc.

Figure 20:
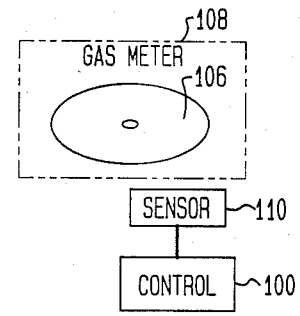
FIG. 20 is a partially schematic, partially block diagram of another system embodying features of the invention and incorporating portions of the system of FIG. 1.
Figure 21:
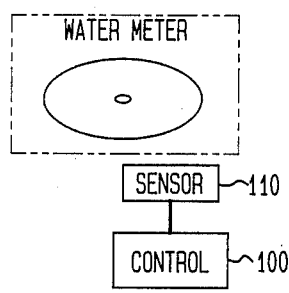
FIG. 21 is a partially schematic, partially block diagram of another system embodying features of the invention and incorporating portions of the system of FIG. 1.

The invention is not limited to remote reading of watt-hour meters. The invention is also useful for remote reading of gas meters, water meters, and electric meters over telephone lines. A gas meter arrangement is shown in FIG. 20. Here, a moving wheel 106 of a gas meter 108 is sensed by a sensor 110 which represents any one of the sensors 26, 28 or 98 or 102. According to separate embodiments of the invention, each of the sensors are used in the sensor 110 in FIG. 20. The sensor 110 is connected to the control and readout 100. FIG. 21 shows a water meter operating with any one of the discs 18 in FIGS. 1, 17, 18, or 19 and a sensor 110 representing any one of the aforementioned sensors.

Figure 22:
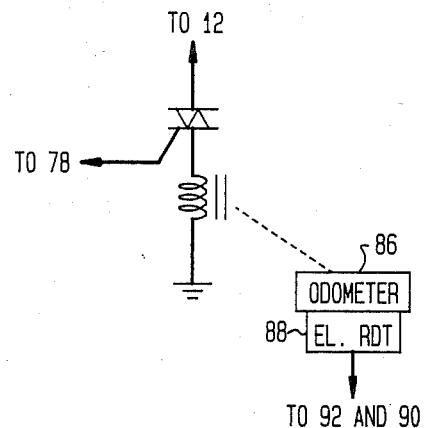
FIG. 22 is a circuit diagram of a variation of a portion of FIG. 1 to be incorporated into FIG. 1 as another embodiment of the invention and to be incorporated as other embodiments of the invention in FIGS. 17, 18, 20, and 21.

According to another embodiment of the invention, the motor 84 is replaced with a stepping relay 112. Such a relay connected to the odometer 86 and the thyristor 82 is shown in FIG. 22. It is contemplated that this structure be combined with the remaining structure of FIG. 1 as shown.

The invention overcomes the lack of torque in ordinary meters and limits the effect upon the meters while permitting remote readout. It allows a mechanical register, such as a watt-hour mechanical register to be driven in order to obtain a non-volatile memory which can be read easily, either electronically or visually. The inability of ordinary meters with insufficient torque to drive such devices is overcome.

The present invention uses a sensor such as an optical sensor, a magnetic sensor, or a capacitive sensor on a disc and drives a torque amplifier in the form of a stepping motor or a solenoid which moves the register in response to the disc motion.

FIGS. 23, 24, and 25 illustrate the details of the odometer 86. Here, the mechanical input from the motor 84 or stepping relay 112 are applied to a gear 120 which is keyed to the lowest order indicator wheel 122 of six indicator wheels 122, 124, 126, 128, 130, and 132, all rotatable about an axle along an axis 134. The rotation of the gear 120 to the wheel 122 is through a hub 136. Each wheel 122 to 132 is covered on the peripheral surface with decimal numerals and is coupled to the adjacent gear through spur gears 142 to 150. The spur gears 142 to 150 engage geared surfaces 152 to 160 on the right faces of the gears 142 to 150 as shown in FIG. 23. The spur gears 142 to 150 further engage gear segments 162 to 170 on the left faces of the wheels 122 to 130 near the peripheries thereof. In the usual manner, as the wheel 122 is advanced ten steps in response to the motor 84 or the relay 112 acting through the gear 120, the gear segment 162 turns toward the spur gear 142 and when it comes into contact with the spur gear 142, turns the spur gear 142. This advances the wheel one step. In this way, the gear segment 164 advances toward the spur gear 144 one step. Thus, one turn of the wheel 122 causes the wheel 124 to advance one step. Similarly, one turn of each wheel 124 to 130 advances the succeeding wheels 126 to 132 one step for each revolution. This motion arrangement of an odometer is well known.

Extending between the wheels 122 and 124, 126 and 128, and 130 and 132, are printed circuit boards 180, 182, and 184. As shown in FIG. 25, each printed circuit board has printed on each face thereof, ten lands 186 that are spaced circularly around a central land 188. As shown in FIG. 24, contacts 190 and 192 extend radially and axially from a circular recess within side faces of each of the wheels 122 to 132. The contacts 190 project toward the circularly spaced lands 186 and the contacts 192 to the central lands 188 and contact these lands. Excess conductive material 196 holds the contacts 192 and 194 within the recess and the wheels. As each of the wheels turn, the respective contacts 190 and 192 connect different lands 186 to the lands 188. This creates an electrical condition representing the position of each of the wheels 122 to 132.

Suitable printed wiring 198 on the boards 180 connect the lands 188 and 186, connected to each other through the contacts 190 and 192, to a flexible printed wiring strip 200. The latter, in turn, connects the wiring on the strip to an integrated circuit chip 202 forming part of the electrical readout 88. The chip 202 decodes the information obtained by the printed circuit boards 180, 182, and 184 concerning the positions of the wheels 122 to 132. The line 92 then transmits the information from the chip to the remote readout 90 which displays the information and records it.

According to an embodiment of the invention, the printed circuit board 180 is omitted and only printed circuit boards 182 and 184 are included. In this way, the positions of the wheels 122 and 124, representing information of the lowest orders of magnitude are not decoded and transmitted to the remote readout 90.

In summary, the odometer 86 operates mechanically like a normal odometer. However, two or three printed circuit boards 182 and 184, or 180, 182, and 184, are placed between the wheels representing the lowest orders of magnitude, the wheels representing the medium orders of magnitude, and the wheels representing the highest orders of magnitude. These printed circuit boards then detect the rotary positions of the wheels 122 to 132 by detecting which of the lands 186 are contacted by the contact 190. The contact 192 remains in continuous contact with the central land 188 in each of the printed circuit boards 180. An electronic chip 202 decodes the positions into electrical signals by obtaining the information through a flexible printed circuit board 200. The decoded information is then transmitted through the line 92 to the readout 90.

While embodiments of the invention have been described in detail, it will be evident to those skilled in the art that the invention may be embodied otherwise without departing from its spirit and scope.

What is claimed is:

1. A system for detection and readout of energy flow in a power line carrying an alternating voltage and current, comprising:
   a watt-hour meter including a sensor for sensing energy in the line and a rotating member with a portion passing a predetermined position during rotation,
   sensing means for sensing the portion and producing signals having signal lengths,
   a mechanical register for accumulating mechanical motions applied thereto and indicating a value representative of the accumulated motions,
   amplifier means for responding to the signals and converting the signals to mechanical motions,
   said amplifier means being coupled to said sensing means so that said amplifier means is arranged to convert the signal sensed by said sensing means to mechanical motions, and coupled to said mechanical register for supplying said mechanical motions to the register so as to cause said register to accumulate the motions of said amplifier means and indicate a value representative of the signals, said amplifier means including:
   pulse forming means responsive to said sensing means for producing pulses, and
   converter means responsive to pulses time displaced from each other by a time greater than the signal lengths,
   said converter means being coupled to the pulse forming means to receive the pulses,
   said amplifier means including coupling means for coupling said amplifier means to the line, said pulse forming means being connected to said coupling means for producing the pulses from the power in the line in synchronism with a component of power in the line.

2. For a rotating member with a portion passing a predetermined position during rotation, an indicator comprising:
   sensing means for sensing the portion and producing signals having signal lengths,
   a mechanical register for accumulating mechanical motions applied thereto and indicating a value representative of the accumulated motions,
   amplifier means for responding to the signals and converting the signals to mechanical motions,
   said amplifier means being coupled to said sensing means so that said amplifier means is arranged to convert the signals sensed by said sensing means to mechanical motions, and coupled to said mechanical register for supplying said mechanical motions to the register so as to cause said register to accumulate the motions of said amplifier means and indicate a value representative of the signals, said amplifier means including:
   pulse forming means responsive to said sensing means for producing pulses, and
   converter means responsive to pulses time displaced from each other by a time greater than the signal lengths for converting pulses to the mechanical motions,
   said converter means being coupled to the pulse forming means to receive the pulses,
   said pulse forming means including:
   a clock arrangement for producing clock impulses synchronized with a power line frequency,
   generator means for producing pulses starting at a synchronizing impulse,
   blanking means for blanking signals over a given time,
   said clock arrangement, said blanking means, and said generator means being coupled to each other and to said sensing means to produce pulses synchronized with the clock signals and the signals and for preventing pulses for a predetermined time after a synchronized pulse.

3. An indicator as in claim 2, wherein said converter means includes:
   a stepping motor for moving in rotary steps in response to the pulses,
   said stepping motor being coupled to the pulse forming means for receiving the pulses.

4. An indicator as in claim 2, wherein said converter means includes:
   a relay having a movable armature and a coil,
   said relay being coupled at the coil to said pulse forming means to receive the pulses and move the armature so that said armature performs the mechanical motions.

5. An indicator as in claims 2, 3, or 4, wherein said pulse forming means includes:
   generator means for forming pulse of predetermined length, and
   blanking means for blanking signals over a predetermined time greater than the predetermined length,
   said blanking means being coupled to said sensing means for starting the predetermined time during a signal and to said generator means for starting a pulse at the start of the predetermined time.

6. An indicator as in claim 2, wherein said clock arrangement is constructed to produce impulses substantially at the zero-crossover times of the power line frequency.

7. An indicator as in claims 2 or 3, wherein said pulse forming means includes a thyristor responsive to said pulses.

8. An indicator as in claim 2, 3, or 4, wherein said register includes a mechanical odometer.

9. An indicator as in claim 8, wherein said register further includes:
   electrical means for sensing the position of mechanical members,
   said odometer having a plurality of mechanical members,
   said odometer being connected to said electrical means and said amplifier means.

10. An indicator as in claim 5, wherein said register includes a mechanical odometer.

11. An indicator as in claim 5, wherein said register further includes:

electrical means for sensing the position of mechanical members, said odometer having a plurality of mechanical members, said odometer being connected to said electrical means and said amplifier means.

12. An indicator as in claim 2, wherein said register includes a mechanical odometer.

13. An indicator as in claim 2, wherein said register further includes:

electrical means for sensing the position of mechanical members, said odometer having a pluraltiy of mechanical members, said odometer being connected to said electrical means and said amplifier means.

14. An indicator as in claim 12, wherein said clock arrangement is constructed to produce impulses substantially at the zero-crossover times of the power line frequency.

15. An indicator as in claim 13, wherein said clock arrangement is constructed to produce impulses substantially at the zero-crossover times of the power line frequency.

16. For a rotating member with a portion passing a predetemined position during rotation, an indicator comprising:

sensing means for sensing the portion and producing signals, a mechanical register for accumulating mechanical motions applied thereto and indicating a value representative of the accumulated motions.

amplifier means for responding to the signals and converting the signals to mechanical motions, said amplifier means being coupled to said sensing means so that said amplifier means is arranged to convert the signals sensed by said sensing means to mechanical motions, and coupled to said mechanical register for supplying said mechanical motions to the register so as to cause said register to accumulate the motions of said amplifier means and indicate a value representative of the signals, said amplifier means including pulse forming means responsive to said sensing means for producing pulses, said pulse forming means including a thyristor responsive to said impulses, said pulse forming means further including:

a clock arrangement for producing a clock impulses synchronized with a power line frequency, generator means for producing pulses starting at a synchronizing impulse, blanking means for blanking signals over a given time, said clock arrangement, said blanking means, and said generator means being coupled to each other and to said sensing means to produce pulses synchronized with the clock signals and the signals and for preventing pulses for a predetermined time after a synchronized pulse.

17. For a rotating having less than three indications passing a predetermined position during each rotation, a device for measuring the number of turns of the member, comprising:

sensing means at the predetermined position for sensing each passage of one of the less than three indications and producing a passage signal during each passage;

circuit means for converting said passage signals to time displaced driver signals each corresponding to a passage signal; and electrical to mechanizal converter means responsive to said driver signals and having an output shaft movable incrementally a fraction of a rotation in response to each of said driver signals on the basis of each one of the less than three indications, said circuit means including:

a clock arrangement for producing clock impulses synchronizing with a power line frequency, generator means for producing pulses starting at a synchronizing impulse, blanking means for blanking signals over a given time, said clock arrangement, said blanking means, and said generator means being coupled to each other and to said sensing means to produce pulses synchronized with the clock signals and the signals and for preventing pulses for a predetermined time after a synchronized pulse.

18. A device as in claim 17, wherein said electrical mechanical converter means includes a stepping motor.

19. For a rotating member with a portion passing a predetermined position during rotation, an indicator comprising:

sensing means for sensing the portion and producing signals, a mechanical register for accumulating mechanical motions applied thereto and indicating a value representative of the accumulated motions, amplifier means for responding to the signals and converting the signals to mechanical motions, said amplifier means being coupled to said sensing means so that said amplifier means is arranged to convert the signals sensed by said sensing means to mechanical motions, and coupled to said mechanical register for supplying said mechanical motions to the register so as to cause said register to accumulate the motions of said amplifier means and indicate a value representative of the signals, said register including a mechanical odometer, said amplifier means including:

a clock arrangement for producing clock impulses synchronized with a power line frequency, generator means for producing pulses starting at a synchronizing impulse, blanking means for blanking signals over a given time, said clock ararngement, said blanking means, and said generator means being coupled to each other and to said sensing means to produce pulses synchronized with the clock signals and the signals and for preventing pulses for a predetermined time after a synchronized pulse.

* * * * *